United States Patent [19]

Brownlow et al.

[11] Patent Number: 4,599,277
[45] Date of Patent: Jul. 8, 1986

[54] CONTROL OF THE SINTERING OF POWDERED METALS

[75] Inventors: James M. Brownlow, Crompond; Robert Rosenberg, Peekskill, both of N.Y.

[73] Assignee: International Business Machines Corp., Armonk, N.Y.

[21] Appl. No.: 659,158

[22] Filed: Oct. 9, 1984

[51] Int. Cl.$^4$ .............................................. B22F 3/00
[52] U.S. Cl. ..................................... 428/552; 419/9; 419/10; 419/19; 419/20; 419/34; 419/45; 419/58; 428/432; 428/548; 428/551; 428/553; 428/639; 428/689
[58] Field of Search .................. 419/9, 10, 34, 20, 45, 419/58, 19; 428/548, 551, 552, 553, 639, 432, 689

[56] References Cited

U.S. PATENT DOCUMENTS 4,507,262  3/1985  Karas et al. ..................... 419/19 X Primary Examiner—Stephen J. Lechert, Jr.
Attorney, Agent, or Firm—Scully, Scott, Murphy & Presser

[57] ABSTRACT

In a process for sintering a metal member bonded to a substrate during which the metal member undergoes densification at a temperature which is different from the curing temperature of the substrate, an improvement is provided which comprises causing the densification temperature of the metal member to be closer to or identical with the curing temperature of the substrate by adding to said metal member prior to sintering an amount of organometallic compound which undergoes decomposition before the densification temperature of the metal member has been reached to provide under the sintering conditions employed a densification temperature-modifying amount of a metal or metal oxide which can be the same as or different from the metal of the aforesaid metal member.

The improved sintering process of the present invention is particularly adapted for use in the fabrication of multilayer ceramic substrates which serve as circuit modules for seminconductor chips.

37 Claims, No Drawings

CONTROL OF THE SINTERING OF POWDERED METALS

TECHNICAL FIELD

This invention relates to the field of processes for fabricating a sintered powdered metal component applied to a substrate. The invention has particular application to the manufacture of multilayer ceramic circuit modules used in the interconnection of large scale integrated devices, e.g., semiconductor chips.

BACKGROUND ART

Blodgett, Jr., et al., "Thermal Conduction Module: A High-Performance Multilayer Ceramic Package", *IBM J. Res. Develop.*, 26, 30-36 (1982), Burger, et al., "Multilayer Ceramics Manufacturing", *IBM J. Res. Develop.*, 27, 11-19 (1983) and Blodgett, Jr., et al., "Microelectronic Packaging", *Scientific American,* Vol. 249, No. 1, pp. 86-96 (July 1983) each describes the fabrication of a multilayer ceramic (MLC) substrate which serves as a circuit module for semiconductor chips. An MLC substrate with its superimposed chip layer can be assembled into a thermal conduction module (TCM) to provide a high density microelectronic package.

According to the referenced publications, the contents of which are incorporated by reference herein, the fabrication of an MLC substrate involves the following operations: slurry preparation, casting/blanking, via hole punching, metallization, stacking/lamination, sintering, nickel/gold plating, substrate electrical test and finally, applying the pins and a metal flange by brazing. Briefly described, these operations are as follows:

SLURRY PREPARATION

A slurry containing a mixture of a ceramic such as alumina, glass powder and organic binder is formed employing a ball mill to achieve a uniform dispersion having the consistency of paint.

CASTING/BLANKING

The slurry is fed to a continuous caster and deposited upon a constantly moving plastic web to form a 200 mm wide ceramic sheet or tape. The caster is provided with a doctor blade which controls the thickness of the sheet, nominally to 0.2 mm or 0.28 mm. The sheet is passed through a series of drying ovens which drive off the organic solvent leaving a flexible material which is then separated from the plastic web and spooled. Square blanks are cut from this "green sheet" (so-called because it is in the unfired state—the sheet is actually white) in preparation for "personalization", a sequence of steps in which each sheet receives its particular metal pattern or conductive pathway.

VIA HOLE PUNCHING

Green sheet personalization utilizes computer controlled step-and-repeat equipment to punch via holes in each green sheet layer. A pallet, used for mounting the green sheets, is an integral part of a precision x-y table that moves the green sheet relative to a stationary die set containing 100 punches at a rate of approximately nine steps per second. A location hole in each corner of the green sheet is used to position the green sheet on the punch pallet. Up to 36,000 via holes are punched in a single green sheet layer.

METALLIZATION

Metallization of the green sheet is accomplished by screening, a process which is similar to stenciling or silk-screen printing, and involves extruding a screening paste, e.g., molybdenum powder uniformly dispersed in a resin and solvent mixture, through a nozzle under pressure as the nozzle traverses a metal mash in contact with the green sheet. This operation simultaneously results in filling the via holes and defining a computer-generated pattern on the green sheet.

STACKING/LAMINATION

Following screening, the metallized layers are dried in a forced-air circulating oven under carefully controlled conditions to avoid dimensional change and damage to the green sheet, particularly on sheets with dense via arrays. Prior to the stacking of individual green sheets, each sheet is inspected for deviations in the screened pattern relative to an optimum configuration. Those sheets which pass inspection are stacked in the desired sequence using the four corner-location holes to ensure accurate layer-to-layer alignment. The via holes are generally only 120 micrometers in diameter and must be continuous from one layer to the next. Accordingly, stacking must be done with great precision to provide the necessary dimensions and alignment. The stacked sheets are then mounted on a lamination die which is precision machined and assembled to ensure parallelism and flatness, an operation which is critical to achieving uniform green laminate density and uniform shrinkage during sintering. During lamination, the substrate is sheared from the green sheet stack and compressed at 75° C. at a pressure of up to 25 MPa.

SINTERING

The substrates are sintered on support plates in a batch kiln over a period of 33 hours. The lamination and sintering processes have been optimized to control shrinkage and ensure precise location of surface features. The linear shrinkage during sintering is approximately 17% and corresponds to a 31% reduction in area.

Residual solvents evaporate and the organic materials start to decompose in a dry hydrogen environment during the initial phase of the sintering cycle. Wet hydrogen is then introduced to accelerate oxidation of residual carbon and, in the range of 1250° C. to 1560° C., sintering of the substrate occurs. The substrate is maintained for a period at the peak temperature to ensure maximum densification and the formation of a firm bond between the ceramic and metallurgy. The wet-hydrogen atmosphere is maintained throughout the sintering phase and the initial part of the cooling cycle, dry hydrogen is introduced during the final stage of cooling to room temperature.

NICKEL/GOLD PLATING

Nickel is plated on the surface features and diffusion-bonded to the molybdenum base metal to enhance adhesion. Following nickel diffusion, a layer of gold is applied to prevent formation of nickel oxide and to enhance wettability during subsequent soldering and brazing processes. The final plating step is the application of gold on the wiring pads surrounding each chip site to accommodate ultrasonic joining of discrete engineering-change wires on the module surface.

SUBSTRATE ELECTRICAL TEST

The correct pattern of interconnections is verified by an automated tester which utilizes data from the computer which controls the metallization operation.

PIN/FLANGE BRAZE

The final operation in the fabrication of an MLC substrate involves simultaneously brazing nickel-gold plated pins and a flange to the substrate in a hydrogen atmosphere using a gold-tin alloy as the brazing material.

In the foregoing process of manufacturing an MLC substrate or, for that matter, any article in which a precise pattern of a metal component applied to a ceramic component is subjected to a sintering, or curing, operation, it is vital that the temperature at which the metal shrinks, or densifies, closely match that at which the ceramic substrate densifies otherwise the integrity of the metal pattern may be lost during the sintering operation. Some metals such as copper tend to undergo densification at a temperature which is well below densification temperature of some common ceramic substrate materials such as alumina. Shrinkage of the copper begins to occur before shrinkage of the substrate and any intricate copper pattern which may have been applied to the substrate in the green state is apt to be disrupted during sintering as a result of stresses produced by the uneven shrinkage of the two materials.

In other types of sintering processes, the reverse of the foregoing situation is encountered but with the same ultimate result, i.e., the substrate densifies before the metal, the resulting uneven shrinkage rates causing disruption to the metal pattern.

Altering the sintering characteristics of a metal by the addition of some substance which will have this effect is known. U.S. Pat. No. 4,322,316 describes a conductor paste sintered on a ceramic substrate wherein the paste is provided with an aluminum oxide glass frit and copper oxide, the paste having a low sintering temperature. U.S. Pat. No. 3,504,058 discloses a process for manufacturing sintered nuclear fuel pellets in which the pellets are coated with an organic sintering inhibitor. U.S. Pat. No. 4,299,629 discloses a sintered nickel alloy powder which is mixed with a nickel alloy additive having a low melting point, producing a high density alloy at a lower sintering temperature. U.S. Pat. No. 3,407,063 teaches the fact that oxide films raise sintering temperature. U.S. Pat. No. 4,115,113 describes the preparation of a sintered molybdenum alloy by combining molybdenum with an organic compound of zirconium which decomposes to form the corresponding oxide, the oxide being reduced to a metal which lowers the sintering temperature.

SUMMARY OF THE INVENTION

In a process for sintering a metal member bonded to a substrate during which the metal member undergoes densification at a temperature which is different from the curing temperature of the substrate, an improvement is provided which comprises causing the densification temperature of the metal member to be closer to or identical with the curing temperature of the substrate by adding to said metal member prior to sintering in amount of organometallic compound which undergoes decomposition before the densification temperature of the metal member has been reached to provide under the sintering conditions employed a densification temperature-modifying amount of a metal or metal oxide which can be the same as or different from the metal of the aforesaid metal member.

As a generality, organometallic compounds which yield free metals during the sintering process tend to promote or accelerate densification of the metal member whereas those organometallic compounds which yield metal oxides during sintering tend to inhibit or retard densification. Thus, by suitable selection of organometallic compound and sintering conditions, one practicing the process of this invention can either lower or raise the densification temperature of the metal in order to more closely approximate the densification, or curing, temperature of the substrate, whichever may be appropriate.

The improved sintering process of the present invention is particularly advantageous when used in the fabrication of MLC substrates as described above. Addition of organometallic compounds to the metal pastes used in the metallization operation will result in the modification of the densification temperature of the metal pattern during the sintering operation making it possible to employ metal members which ordinarily have substantially different densification profiles from those of the ceramic substrates to which they are bonded.

DESCRIPTION OF THE PREFERRED EMBODIMENTS

The metal member which is to undergo sintering may be a single metal, mechanical mixture of metals or an alloy of one or more metals. Among the commonly encountered metals in MLC technology are molybdenum, nickel, copper, silver, gold, platinum, and the like. The nature of the metal member is not critical since the functional principle of the present invention is valid for all types of metals and metal alloys.

Similarly, the selection of organometallic compound and the amount thereof which is added to the metal member (generally when the latter is in the form of a screening paste as described supra) are not critical matters and can be selected by means of simple and routine experimentation to provide the desired results for a particular sintering operation.

The organometallic compound must be capable of dissolving in the organic solvent solution of polymeric organic binder which is used in the metal paste and must also be capable of undergoing decomposition during sintering to an oxide. While in no way wishing to be bound, it is believed that the metal oxide resulting from the decomposition of the organometallic compound during the sintering operation coats the particles of metal constituting the metal member and, in this way, causes the metal particles to undergo densification at a temperature which more closely approximates the densification temperature of the substrate.

The optimum selection of organometallic compound will, of course, depend on the nature of the particular metal member-substrate combination employed and can be readily determined employing routine testing procedures.

The sintering conditions must provide an atmosphere which is low enough in oxygen (or any other oxidizing agent) to avoid oxidation of the metal member.

Some organometallics will decompose during sintering to provide metal oxides which, as previously noted, tend to delay densification of the metal member to which they are added (by increasing the densification temperature), the duration of the delay being a function of the nature of the metal member, the nature of the metal oxide and the amount of the latter which is present. Included among the organometallics of this type are the metal acetyl acetonates and metal alkoxides which decompose to the corresponding metal oxides during the sintering operation. Two such compounds, aluminum acetyl acetonate and aluminum di-(i-propoxide), yield aluminum oxide upon decomposition, this oxide having been found to be particularly advantageous for increasing the densification temperature of copper metal by as much as 150° C. in some cases. Other organometallic compounds which can be used to delay densification include silicon oxysilane, magnesium acetate and a variety of zirconium organics.

Still other organometallic compounds which have been found to retard the shrinkage of copper are set forth in the following table:

TABLE I

ORGANOMETALLICS RETARDING SHRINKAGE OF COPPER (TO PROVIDE 0.18 WT. % OXIDE)

| | Oxide | Temp °C. | % linear Shrinkage |
|---|---|---|---|
| Magnesium Acetate | MgO | 800 | 12.0 |
| (γ-glycidoxy propyl) trimethyoxysilane | $SiO_2$ | 800 | 13.3 |
| Titanium (di-i-propoxide) bis(2,4-pentanedionate) | $TiO_2$ | 800 | 10.5 |
| Zirconium-n-propoxide | $ZrO_2$ | 800 | 10.0 |
| Aluminum-di-(i-propoxide) aceto acetic ester chelate | $Al_2O_3$ | 800 | 3.9 |
| No addition | — | 800 | 17.0 |

Organometallic compounds which decompose under sintering conditions to provide free metals include a number of metal acetyl acetonates, e.g., copper acetyl acetonate, such metal tending to reduce the densification of the host metal, e.g., copper, to which they are added.

Combinations of organometallic compounds can be used including combinations which provide both free metal and metal oxide upon sintering. The total amount of organometallic compound to be added to the metal member prior to sintering can vary widely with amounts of from 0.01% to 1.5% by weight of said metal member and even higher resulting in appreciable modification of the densification temperature of the metal member. The particle size of the organometallic compound can vary over wide limits with a range of average partile size of from about 0.01 microns to about 5 microns generally providing good results.

The following examples are illustrative of the process of the present invention.

The invention herein is especially adapted to be applied to glasses, refractory oxides and other ceramic materials. Choice of a particular substrate will, in part, depend upon the choice of metal member; e.g., in the case of copper as the metal member, which has a relatively low melting point (1083° C.), the substrate must have a sintering temperature of no more than about 1050° C.

The ceramic employed in the examples, infra, illustrating the invention approximate the composition of the mineral cordierite as follows:

| Oxide | Mole % |
|---|---|
| $SiO_2$ | 50 |
| $Al_2O_3$ | 25 |
| MgO | 25 |

This composition also contains as much as 5 mole percent of $B_2O_3$ and $P_2O_5$. Other typical refractory materials include, for example, Pyrex glass (Dow Corning's low expansion, heat resistant glass) and E glass the approximate oxide composition (mole %) of which are as follows:

| Oxide | Pyrex | E glass |
|---|---|---|
| $SiO_2$ | 85 | 60 |
| $Al_2O_3$ | 1 | 14 |
| $B_2O_3$ | 10 | 15 |
| CaO | 0 | 11 |
| $Na_2O$ | 4 | 0 |

Operating in a known manner, the selected substrate in the form of a powder is slurried with a solvent solution of resin binder to the consistency of paint, the slurry is cast into sheets and the solvent driven off to provide a "green-sheet" as previously described. The examples herein employ the following slurry:

| Component | Wt. in grams |
|---|---|
| methylisobutyl ketone | 55.8 |
| methanol | 18.5 |
| Butvar B-98 (Monsanto's polyvinyl-butyral resin) | 10.8 |
| Benzoflex (Tennessee Products & Chemical Corp.'s glycol dibenzoates) | 3.6 |
| Glass Powder | 130.6 |
| Total | 219.3 |

EXAMPLE 1

This example demonstrates the effect of adding aluminum di-(i-propoxide) aceto acetic ester chelate to copper metal upon the densification temperature of the latter and illustrates a simple procedure which can be routinely employed for determining and measuring the densification temperature-modifying effect of a variety of organometallic compound upon their host metals.

The following screening pastes containing copper powder (Metz Company, WISA #7, 1-3 microns average particle size) were prepared.

| Component | Sample (Wt. in grams) | | | |
|---|---|---|---|---|
| | A | B | C | D |
| copper powder | 85 | 85 | 85 | 85 |
| ethyl cellulose (binder) | 1.5 | 1.5 | 1.5 | 1.5 |
| butyl carbitol (solvent) | 13.5 | 13.5 | 13.5 | 13.5 |
| aluminum di-(i-propoxide) aceto acetic ester chelate (decomposes to $Al_2O_3$ upon sintering) | 0 | .229 | .411 | 1.21 |

These pastes were applied to individual pieces of green-sheets prepared as described above.

Following drying at 150° C., the coated pieces were placed in a cold tube furnace containing water through which 1% $H_2$, 99% $N_2$ by volume was bubbled. The temperature was raised to 650° C., held thereat for 30 minutes and then the boat holding each coated piece was pulled toward the cold end of the tube. The amount of linear shrinkage was measured and noted. The pieces were then reinserted in the furnace and fired at a 50° C. higher temperature. This was repeated several times until the final sintering temperature of 950° C. was reached. (This procedure was also used in the examples which follow.)

The amount of linear shrinkage of the copper metal coating was then measured, the results being set forth in Table II as follows:

TABLE II

| Sintering Temperature °C. | % LINEAR SHRINKAGE | | | | |
|---|---|---|---|---|---|
| | Ceramic Only | Sample ($Al_2O_3$ in Wt. %) | | | |
| | | A (No $Al_2O_3$) | B 0.07 $Al_2O_3$ | C 0.18 $Al_2O_3$ | D 0.53 $Al_2O_3$ |
| 650 | 0 | 0 | 0 | 0 | 0 |
| 700 | 0 | 7.0 | 0 | 0 | 0 |
| 750 | 0 | 16.0 | 0 | 0 | 0 |
| 780 | 0 | 16.6 | 6.3 | 0 | 0 |
| 800 | 9.6 | 17.0 | 10.0 | 3.9 | 3.0 |
| 850 | 17.0 | 17.0 | 15.0 | 6.0 | 4.2 |
| 900 | 17.0 | 17.0 | 17.0 | 10.0 | 8.0 |
| 950 | 17.0 | 17.0 | 17.0 | 14.0 | 11.0 |

These data clearly demonstrate the effect of the presence of alumina in delaying the rate of densification of the copper metal layer (measured in terms of % linear shrinkage) to match more closely the rate of densification of the substrate ceramic.

EXAMPLE 2

This example demonstrates the improved sintering process of the present invention in the fabrication of copper on ceramic employing aluminum-acetyl acetonate as the organometallic component.

Following the same procedure as in Example 1, the following copper (Metz Company, WISA #7, 1-3 microns average particle size) screening pastes were prepared.

| Component | Sample (Wt. in grams) | | |
|---|---|---|---|
| | A | B | C |
| copper powder | 85 | 85 | 85 |
| ethyl cellulose | 1.5 | 1.5 | 1.5 |
| butyl carbitol | 13.5 | 13.5 | 13.5 |
| aluminum-acetyl acetonate (decomposes to $Al_2O_3$ upon sintering) | 0 | .217 | .654 |

The pastes were applied to pieces of green-sheet prepared as before and sintered at various temperatures employing the procedure of Example 1. The percent linear shrinkage of each sample was measured, the results being set forth in Table III as follows:

TABLE III

| Sintering Temperature °C. | % LINEAR SHRINKAGE | | | |
|---|---|---|---|---|
| | Ceramic Only | Sample ($Al_2O_3$ in Wt. %) | | |
| | | A (No $Al_2O_3$) | B 0.08 $Al_2O_3$ | C 0.24 $Al_2O_3$ |
| 650 | 0 | 0 | 0 | 0 |
| 700 | 0 | 7.0 | 2 | 0 |
| 750 | 0 | 16.0 | 3.5 | 0 |
| 780 | 0 | 16.6 | 6.0 | 0 |
| 800 | 9.6 | 17.0 | 10.0 | 0 |
| 850 | 17.0 | 17.0 | 15.0 | 10.2 |
| 900 | 17.0 | 17.0 | 17.0 | 17.0 |
| 950 | 17.0 | 17.0 | 17.0 | 17.0 |

These data similarly demonstrate the beneficial effects of the addition of aluminum acetyl-acetonate as the organometallic compound.

EXAMPLE 3

The invention herein also contemplates the direct addition of metal oxide particles to the metal member prior to sintering although the resulting improvement in matching the densification temperature of the metal member with that of the substrate is not as pronounced as it is when an organometallic compound is employed. The amount of metal oxide powder can vary widely with amounts of from about 0.01% to about 2.0% and even higher generally providing good results. The average particle size of the powder can also vary widely, with particle size ranges of from 0.01 to 5 microns being entirely suitable in most cases. The oxides of magnesium, titanium, zirconium and aluminum are illustrative of the metal oxides which can be employed herein.

In Table IV below, the effect of the addition of $Al_2O_3$ powder (Linde Division of Union Carbide Corp. 0.05 microns average particle size) on the densification behavior of a copper screening paste on ceramic substrate (as in the previous examples) is shown:

TABLE IV

| Sintering Temperature °C. | % LINEAR SHRINKAGE | | | |
|---|---|---|---|---|
| | Ceramic Only | Sample ($Al_2O_3$ in Wt. %) | | |
| | | A (No $Al_2O_3$) | B 0.15 $Al_2O_3$ | C 0.30 $Al_2O_3$ | D 0.60 $Al_2O_3$ |
| 650 | 0 | 0 | .15 | | |
| 700 | 0 | 7.0 | | | |
| 750 | 0 | 16.0 | 10.4 | 3.0 | 2.0 |
| 780 | 0 | 16.6 | | | |
| 800 | 9.6 | 17.0 | 15.0 | 10.0 | 3.0 |
| 850 | 17.0 | 17.0 | 17.0 | 17.0 | |
| 900 | 17.0 | 17.0 | 17.0 | 17.0 | 13.0 |

TABLE IV-continued

| Sintering Temperature °C. | % LINEAR SHRINKAGE | | | | |
|---|---|---|---|---|---|
| | Sample ($Al_2O_3$ in Wt. %) | | | | |
| | Ceramic Only | A (No $Al_2O_3$) | B 0.15 $Al_2O_3$ | C 0.30 $Al_2O_3$ | D 0.60 $Al_2O_3$ |
| 950 | 17.0 | 17.0 | 17.0 | 17.0 | 17.0 |

Having thus described our invention, what we claim as new and desire to secure by Letters Patent is:

1. In a process for sintering a metal member bonded to a substrate during which the metal member undergoes densification at a temperature which is different from the curing temperature of the substrate, the improvement which comprises causing the densification temperature of the metal member to be closer to or identical with the curing temperature of the substrate by adding to said metal member prior to sintering an amount of organometallic compound which undergoes decomposition before the densification temperature of the metal member has been reached to provide under the sintering conditions employed a densification temperature-modifying amount of a metal or metal oxide which can be the same as or different from the metal of the aforesaid metal member.

2. The process of claim 1 wherein the metal member is selected from the group consisting of copper, nickel, molybdenum, silver, gold and platinum or a metal alloy containing any of the foregoing.

3. The process of claim 1 wherein the substrate contains a refractory oxide.

4. The process of claim 3 wherein the refractory oxide is cordierite ceramic.

5. The process of claim 1 wherein the organometallic compound decomposes to provide a metal component which increases the densification temperature of the metal member.

6. The process of claim 5 wherein the organometallic compound is a metal acetyl acetonate which decomposes to provide a metal oxide.

7. The process of claim 6 wherein the metal acetyl acetonate is aluminum acetyl acetonate which decomposes to provide alumina.

8. The process of claim 1 wherein the organometallic component decomposes to provide a metal component which decreases the densification temperature of the metal member.

9. The process of claim 8 wherein the organometallic compound is a metal acetyl acetonate which decomposes to provide a metal.

10. The process of claim 9 wherein the metal acetyl acetonate is copper acetyl acetonate which decomposes to provide copper metal.

11. The process of claim 1 wherein sintering is carried out within the range of from about 500° C. to about 1800° C. in the presence or absence of a reducing atmosphere.

12. The process of claim 11 wherein sintering is carried out within the range of from about 600° C. to about 1000° C. in the presence or absence of a reducing atmosphere.

13. In a process for fabricating a multilayer ceramic substrate wherein individual layers of ceramic substrate having a metal pattern bonded thereto are subjected to sintering resulting in the densification of the metal contained in the metal pattern and the curing of the ceramic substrate, the temperature at which the metal undergoes densification being different from the temperature at which the ceramic substrate undergoes curing, the improvement which comprises causing the densification temperature of the metal contained in the metal pattern to be closer to or identical with the curing temperature of the ceramic substrate by adding to said metal prior to sintering an amount of organometallic compound which undergoes decomposition before the densification temperature of the metal has been reached to provide under the sintering conditions employed a densification temperature-modifying amount of a free metal or metal oxide, the metal component of which can be the same as or different from the metal contained in the metal pattern.

14. The process of claim 13 wherein the metal pattern contains a metal selected from the group consisting of copper, nickel, molybdenum, silver, gold, platinum or a metal alloy containing any of the foregoing.

15. The process of claim 13 wherein the ceramic substrate contains a refractory oxide.

16. The process of claim 13 wherein the refractory oxide contains alumina.

17. The process of claim 13 wherein the metal pattern is made with copper and the ceramic substrate contains alumina.

18. The process of claim 13 wherein the organometallic compound decomposes to provide a metal component which increases the densification temperature of the metal contained in the metal pattern.

19. The process of claim 18 wherein the organometallic component is a metal acetyl acetonate which decomposes to provide a metal oxide.

20. The process of claim 19 wherein the organometallic component is aluminum acetyl acetonate which decomposes to provide alumina.

21. The process of claim 13 wherein sintering is carried out within the range of from about 500° C. to about 1800° C. in the presence or absence of a reducing atmosphere.

22. An uncured substrate having a non-densified metal member bonded thereto which is especially adapted to be sintered wherein said metal member contains an amount of organometallic compound which will undergo decomposition under sintering conditions and before the densification temperature of the metal member has been reached to provide a densification temperature-modifying amount of a metal or metal oxide which is the same as or different from the metal of the metal member.

23. In a process for sintering a metal member bonded to a substrate during which the metal member undergoes densification at a temperature which is different from the curing temperature of the substrate, the improvement which comprises causing the densification temperature of the metal member to be closer to or identical with the curing temperature of the substrate by adding to said metal member prior to sintering a densification temperature-modifying amount of a metal oxide which can be the same as or different from the metal of the aforesaid metal member.

24. The process of claim 23 wherein the metal member is selected from the group consisting of copper, nickel, molybdenum, silver, gold, platinum and alloys thereof.

25. The process of claim 23 wherein the substrate contains a refractory oxide.

26. The process of claim 23 wherein the refractory oxide is cordierite ceramic.

27. The process of claim 23 wherein the metal oxide is an oxide of magnesium, titanium, zirconium or aluminum.

28. The process of claim 23 wherein sintering is carried out within the range of from about 500° C. to about 1800° C. in the presence or absence of a reducing atmosphere.

29. The process of claim 28 wherein sintering is carried out within the range of from about 600° C. to about 1000° C. in the presence of absence of a reducing atmosphere.

30. In a process for fabricating a multilayer ceramic substrate wherein individual layers of ceramic substrate having a metal pattern bonded thereto are subjected to sintering resulting in the densification of the metal contained in the metal pattern and the curing of the ceramic substrate, the temperature at which the metal undergoes densification being different from the temperature at which the ceramic substrate undergoes curing, the improvement which comprises causing the densification temperature of the metal contained in the metal pattern to be closer to or identical with the curing temperature of the ceramic substrate by adding to said metal prior to sintering a densification temperature-modifying amount of a metal oxide, the metal component of which can be the same as or different from the metal contained in the metal pattern.

31. The process of claim 30 wherein the pattern contains a metal selected from the group consisting of copper, nickel, molybdenum, silver, gold, platinum or a metal alloy containing any of the foregoing.

32. The process of claim 30 wherein the ceramic substrate contains a refractory oxide.

33. The process of claim 32 wherein the refractory oxide contains alumina.

34. The process of claim 30 wherein the metal pattern is made with copper and the ceramic substrate contains alumina.

35. The process of claim 30 wherein the metal oxide is an oxide of magnesium, titanium, zirconium or aluminum.

36. The process of claim 30 wherein sintering is carried out within the range of from about 500° C. to about 1800° C. in the presence or absence of a reducing atmosphere.

37. An uncured substrate having a non-densified metal member bonded thereto which is especially adapted to be sintered wherein said metal member contains a densification temperature-modifying amount of a metal or metal oxide which is the same as or different from the metal of the metal member.

* * * * *